(12) United States Patent
Kim et al.

(10) Patent No.: US 10,651,074 B2
(45) Date of Patent: May 12, 2020

(54) SUBSTRATE PROCESSING APPARATUS AND METHOD OF MANUFACTURE USING THE SAME

(71) Applicant: Samsung Electronics Co., Ltd., Suwon-si (KR)

(72) Inventors: Kyoung Hwan Kim, Yongin-si (KR); Taewoo Kang, Suwon-si (KR); Byung Lyul Park, Seoul (KR); Hyungjun Jeon, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 559 days.

(21) Appl. No.: 15/595,948

(22) Filed: May 16, 2017

(65) Prior Publication Data

US 2018/0114714 A1    Apr. 26, 2018

(30) Foreign Application Priority Data

Oct. 26, 2016    (KR) .................. 10-2016-0140294

(51) Int. Cl.
| | |
|---|---|
| *H01L 21/683* | (2006.01) |
| *B65G 47/91* | (2006.01) |
| *C23C 16/458* | (2006.01) |
| *H01L 21/67* | (2006.01) |
| *H01L 21/687* | (2006.01) |

(52) U.S. Cl.
CPC ........ *H01L 21/6838* (2013.01); *B65G 47/911* (2013.01); *C23C 16/4583* (2013.01); *H01L 21/67063* (2013.01); *H01L 21/67259* (2013.01); *H01L 21/67288* (2013.01); *H01L 21/68721* (2013.01); *H01L 21/68742* (2013.01)

(58) Field of Classification Search
CPC .............................. B25B 11/00; B25B 11/005
See application file for complete search history.

(56) References Cited

U.S. PATENT DOCUMENTS

| | | | |
|---|---|---|---|
| 2009/0179366 A1* | 7/2009 | Herchen | ........... H01L 21/67126 269/21 |
| 2011/0061999 A1 | 3/2011 | Cho | |
| 2015/0214090 A1* | 7/2015 | Jin | ...................... H01L 21/6838 269/13 |

(Continued)

FOREIGN PATENT DOCUMENTS

| | | |
|---|---|---|
| JP | 2004-265962 A | 9/2004 |
| JP | 2006-6319345 A | 11/2006 |
| JP | 2008-081270 A | 4/2008 |

(Continued)

*Primary Examiner* — Lee D Wilson
(74) *Attorney, Agent, or Firm* — Muir Patent Law, PLLC

(57) ABSTRACT

A substrate processing apparatus may include a substrate jig device and a transfer unit, which is configured to hold a substrate in a non-contact state and move the substrate toward the substrate jig device. The substrate jig device may include a supporter, which is configured to support an edge of the substrate and have an opening, a first suction part, which overlaps with a center region of the opening and is configured to move in a first direction, and a plurality of second suction parts, which overlap with an edge region of the opening and are configured to move toward the opening. Here, the first direction may be a direction passing through the opening.

20 Claims, 16 Drawing Sheets

(56) References Cited

U.S. PATENT DOCUMENTS

2016/0005636 A1* 1/2016 Ichinose ............. H01L 21/6838
                                                            355/30
2018/0114714 A1* 4/2018 Kim .................. H01L 21/67259

FOREIGN PATENT DOCUMENTS

| JP | 2013-119140 A | 6/2013 |
| KR | 20-2009-0010371 U | 10/2009 |
| KR | 10-2014-0144369 A | 12/2014 |
| KR | 10-1606850 B1 | 3/2016 |

* cited by examiner

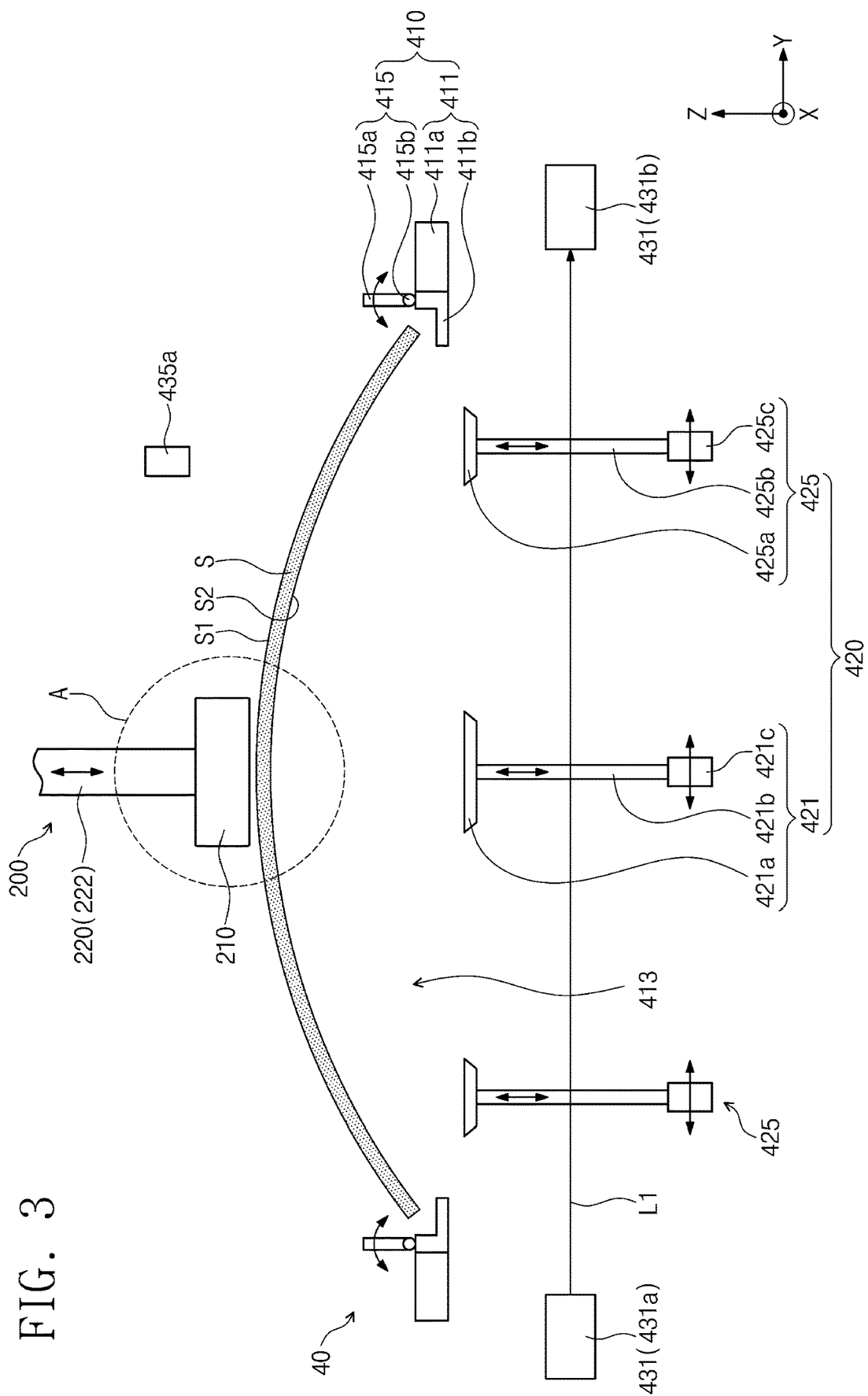

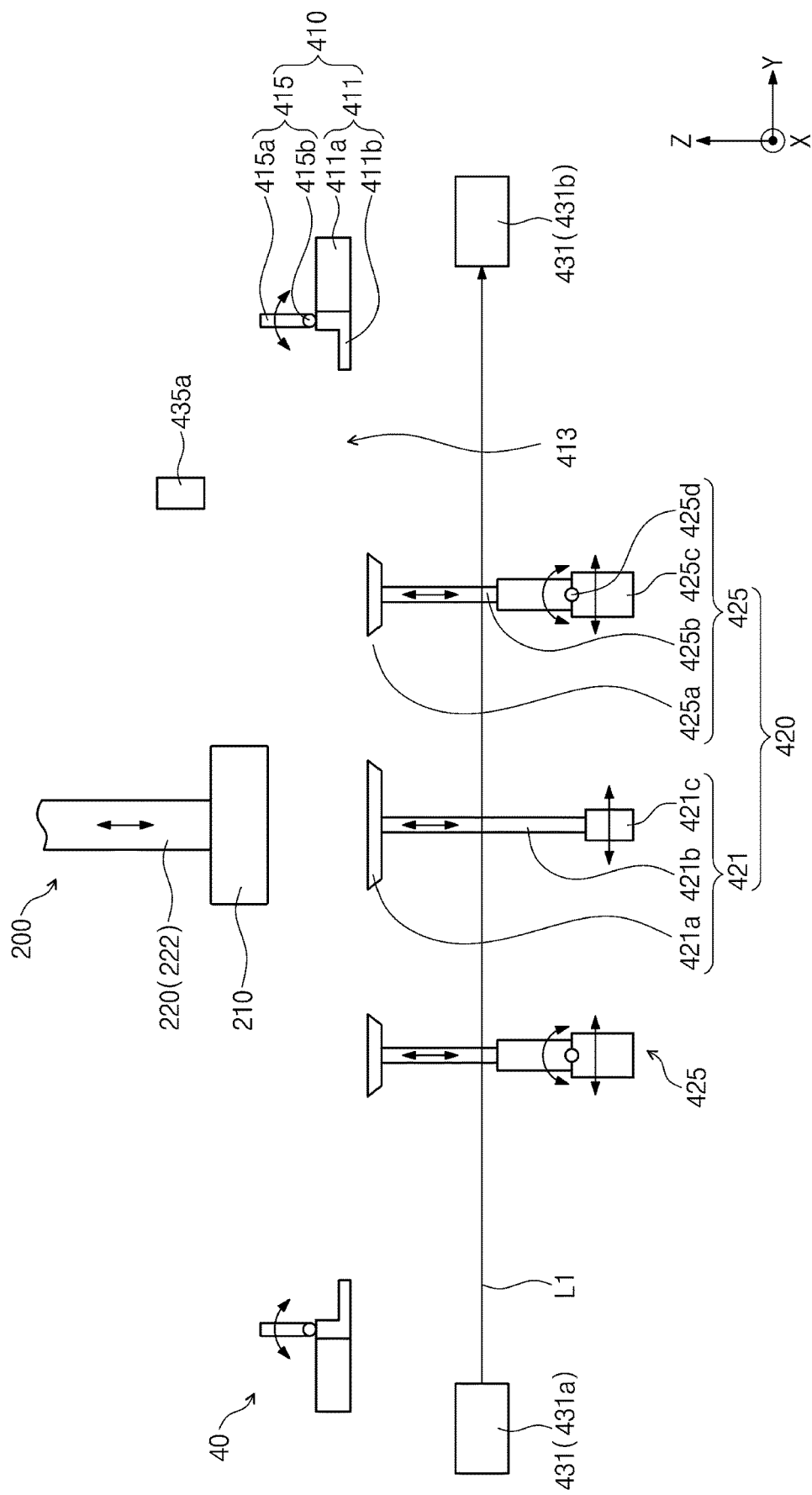

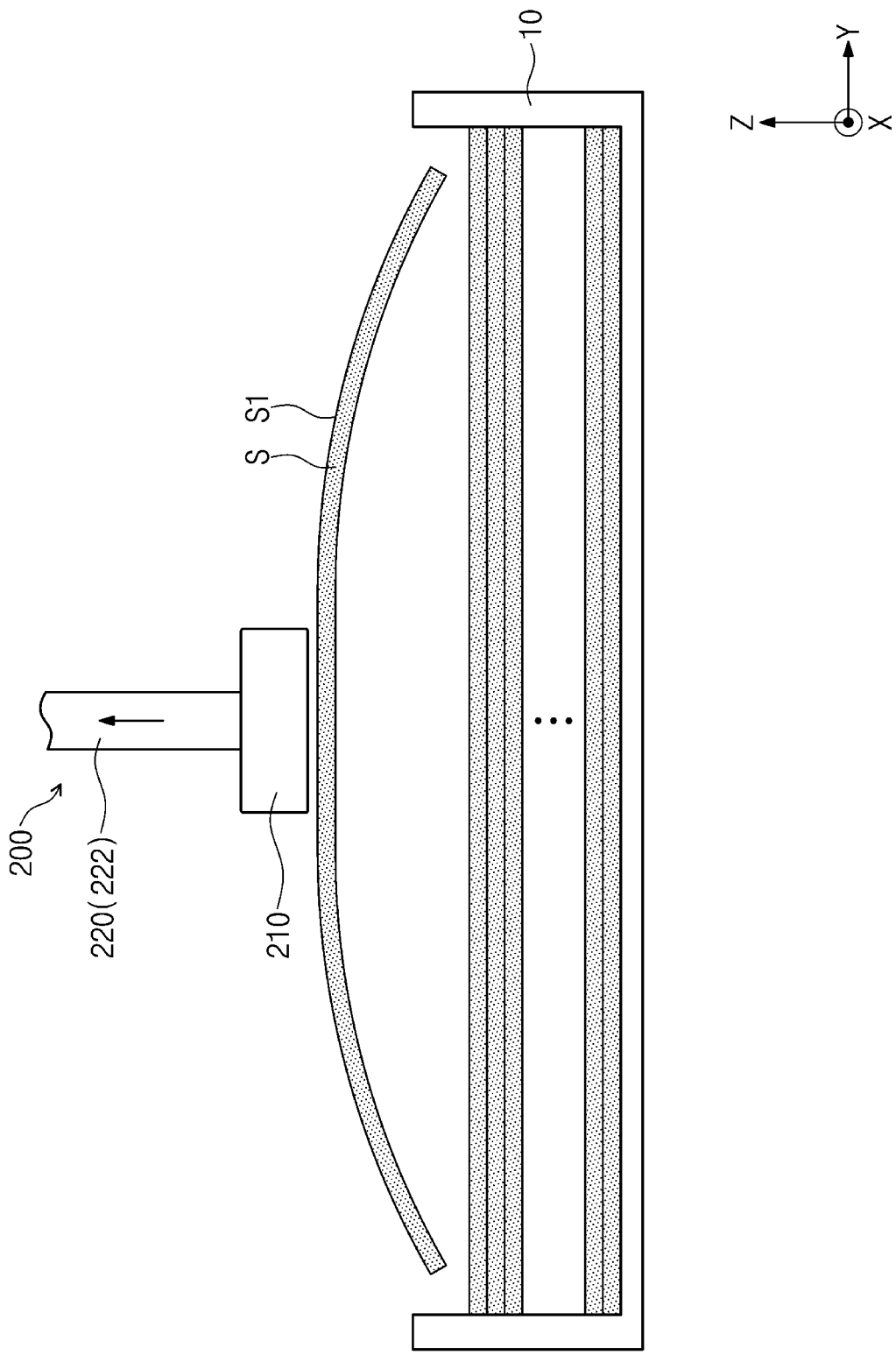

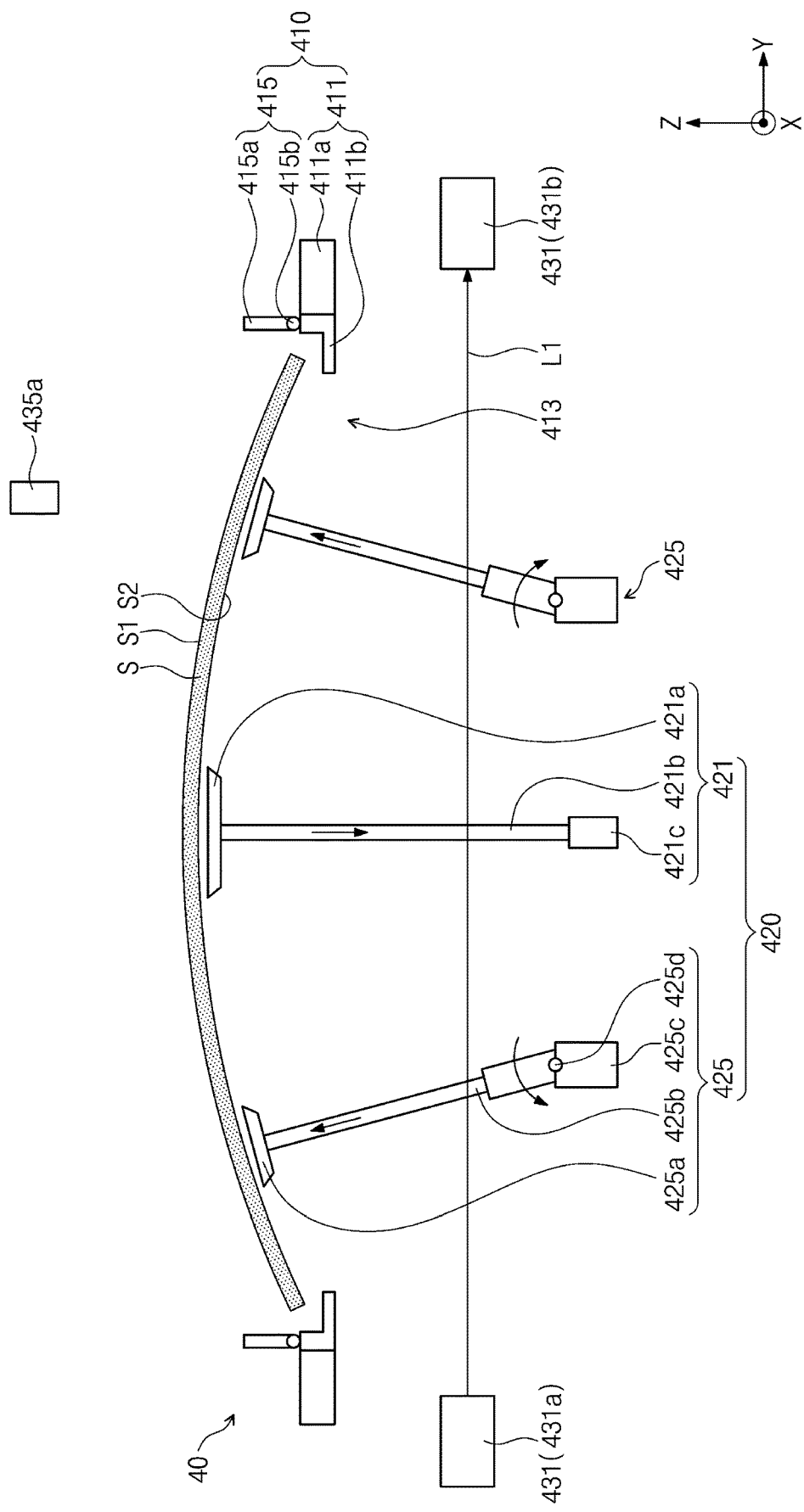

US 10,651,074 B2

SUBSTRATE PROCESSING APPARATUS AND METHOD OF MANUFACTURE USING THE SAME

CROSS-REFERENCE TO RELATED APPLICATIONS

This application claims priority under 35 U.S.C. § 119 to Korean Patent Application No. 10-2016-0140294, filed on Oct. 26, 2016, in the Korean Intellectual Property Office, the entire contents of which are hereby incorporated by reference.

BACKGROUND OF THE INVENTION

The present disclosure relates to a substrate processing apparatus.

In general, semiconductor packages are widely used to meet an increasing demand for information processing devices with various functions and fast operating speeds. Furthermore, due to recent consumer's demand, information processing devices are being scaled down. Thus, a package substrate provided in a semiconductor package becomes thinner and thinner. However, in the case where the package substrate is fabricated to be thin, a warpage issue may easily occur in the package substrate when the semiconductor package is fabricated. The warpage issue of the package substrate may lead to a failure of a semiconductor package. Accordingly, many studies are being conducted to prevent the warpage issue in the package substrate.

SUMMARY

Some embodiments of the inventive concept provide a substrate processing apparatus which is configured to adjust flatness of a substrate before performing various processes.

Some embodiments of the inventive concept provide a substrate processing apparatus which is configured to prevent breakage of a contact portion which may occur when a substrate is transferred.

According to some embodiments of the inventive concept, a substrate processing apparatus may include a substrate jig device and a transfer unit configured to hold a substrate in a non-contact state and transfer the substrate toward the substrate jig device. The substrate jig device may include a supporter configured to support an edge of the substrate and having an opening, a first suction part overlapping with a center region of the opening and configured to move in a first direction, and a plurality of second suction parts overlapping with an edge region of the opening and configured to move toward the opening. Here, the first direction may be a direction passing through the opening.

According to some embodiments of the inventive concept, a substrate processing apparatus may include a substrate jig device and a transfer unit including at least one floating chuck and a transfer driving unit. The floating chuck may be configured to hold a substrate in a non-contact state, and the transfer driving unit may be configured to transfer the floating chuck toward the substrate jig device. The substrate jig device may include a ring-shaped supporter with an opening and a suction unit including a plurality of suction parts which overlap with the opening and are configured to move toward the opening. The suction parts may include a first suction part configured to move in a first direction and to hold a center region of the substrate transferred by the transfer unit, and a plurality of second suction parts configured to move toward the opening and to hold an edge region of the substrate transferred by the transfer unit. Here, the first direction may be a direction penetrating the opening.

According to some embodiments, a method may include steps of holding a first surface of a substrate with a chuck from a substrate carrier, transferring the substrate above a first suction unit while the first surface of the substrate is held with the chuck, holding a first portion of a second surface of the substrate with the first suction unit, and releasing the first surface of the substrate from the chuck, wherein the chuck holds the first surface of the substrate in a non-contact method, wherein the second surface of the substrate is opposite the first surface of the substrate.

According to some embodiments, a method may include steps of holding a center portion of a substrate with a first suction pad, flattening a warpage portion of the substrate with a second suction pad, receiving the substrate on a supporter, clamping edge portions of the substrate to hold the substrate after flattening the warpage portion of the substrate with the second suction pad, and performing a following process on the substrate.

According to certain embodiments, a method may include steps of holding a substrate with a non-contact chuck from a substrate carrier, transferring the substrate above a plurality of suction pads while the substrate is held with the non-contact chuck, holding the substrate with at least one of the plurality of suction pads, releasing the substrate from the non-contact chuck, inspecting a flatness of the substrate with a sensor, flattening a warpage portion of the substrate with at least one of the plurality of the suction pads, and clamping edge portions of the substrate to hold the substrate on a substrate supporter after flattening the warpage portion of the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 3 is a schematic diagram illustrating the substrate processing apparatus of FIG. 1, according to some embodiments.

FIGS. 5 and 6 are schematic diagrams illustrating modified examples of the substrate processing apparatus of FIG. 1, according to some embodiments.

FIGS. 7A to 7G are schematic diagrams that are presented to describe a process of operating the substrate processing apparatus of FIG. 1, according to some embodiments.

FIGS. 8A to 8C are schematic diagrams that are presented to describe a process of operating the substrate processing apparatus of FIG. 5, according to some embodiments.

DETAILED DESCRIPTION

Figure 1:
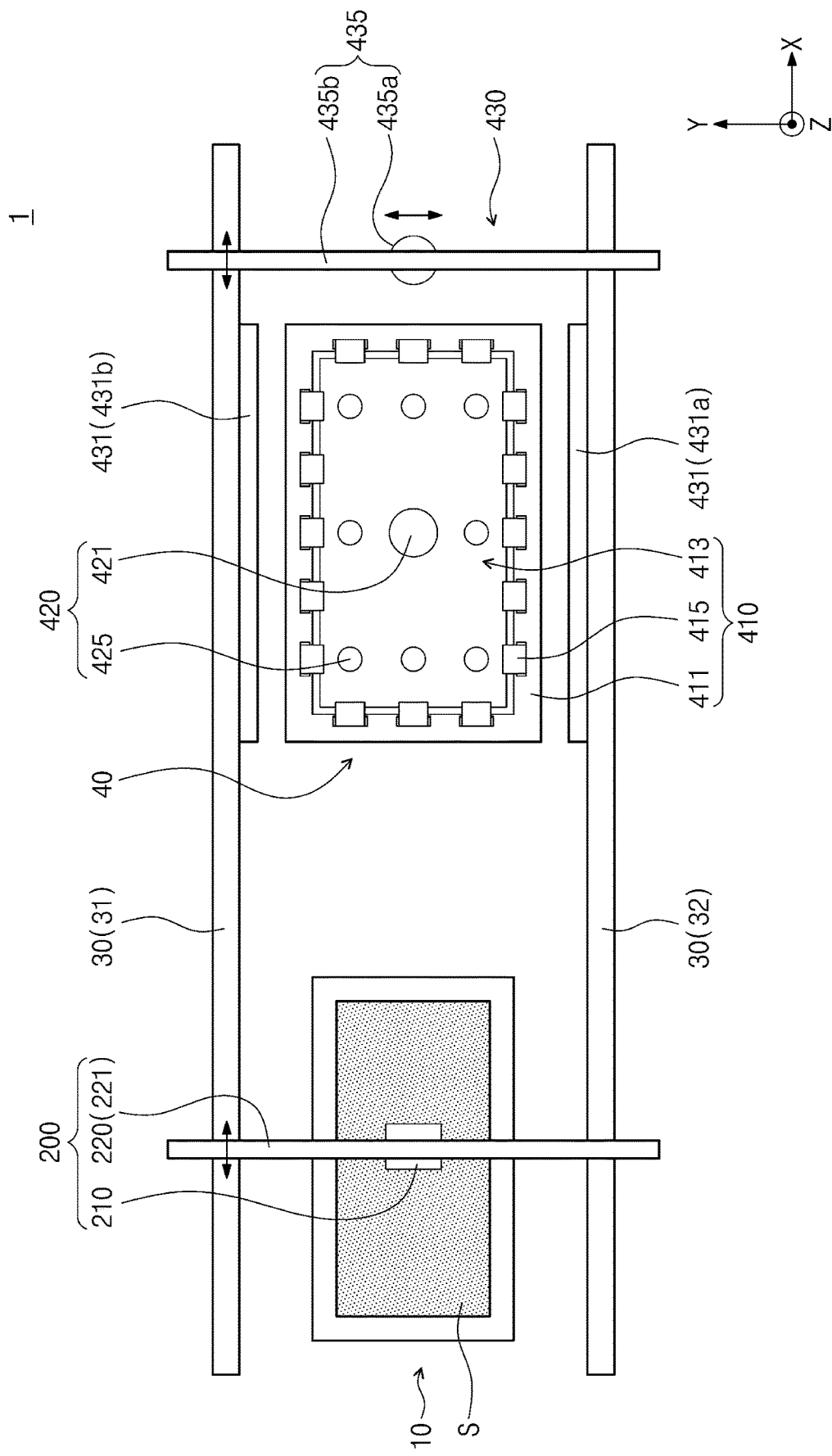
FIG. 1 is a plan view illustrating a substrate processing apparatus according to some embodiments of the inventive concept.

Hereinafter, the present disclosure will be described in detail with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, like numbers refer to like elements throughout. Though the different figures show various features of exemplary embodiments, these figures and their features are not necessarily intended to be mutually exclusive from each other. Rather, certain features depicted and described in a particular figure may also be implemented with embodiment(s) depicted in different figure(s), even if such a combination is not separately illustrated. Referencing such features/figures with different embodiment labels (e.g. "first embodiment") should not be interpreted as indicating certain features of one embodiment are mutually exclusive of and are not intended to be used with another embodiment.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

As used herein, the singular forms "a", "an" and "the" are intended to include the plural forms as well, unless the context clearly indicates otherwise. As used herein, the term "and/or" includes any and all combinations of one or more of the associated listed items and may be abbreviated as "/". With the exception of "consisting of" and "essentially consisting of," it will be further understood that all transition terms describing elements of a step, component, device, etc., are open ended. Thus, unless otherwise specified (e.g., with language such as "only," "without," etc.), the terms "comprising," "including," "having," etc., may specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected," "coupled to" or "on" another element, it can be directly connected/coupled to/on the other element or intervening elements may be present. In contrast, when an element is referred to as being "directly connected" or "directly coupled" to another element, or as "contacting" or "in contact with" another element, there are no intervening elements present.

Spatially relative terms, such as "beneath," "below," "lower," "above," "upper" and the like, may be used herein for ease of description to describe one element's or feature's positional relationship relative to another element(s) or feature(s) as illustrated in the figures. It will be understood that such spatially relative terms are intended to encompass different orientations of the device in use or operation in addition to the orientation depicted in the figures. Thus, a device depicted and/or described herein to have element A below element B, is still deemed to have element A below element B no matter the orientation of the device in the real world.

Embodiments may be illustrated herein with idealized views (although relative sizes may be exaggerated for clarity). It will be appreciated that actual implementation may vary from these exemplary views depending on manufacturing technologies and/or tolerances. Therefore, descriptions of certain features using terms such as "same," "equal," and geometric descriptions such as "planar," "coplanar," "cylindrical," "square," etc., as used herein when referring to orientation, layout, location, shapes, sizes, amounts, or other measures, encompass acceptable variations from exact identicality, including nearly identical layout, location, shapes, sizes, amounts, or other measures within acceptable variations that may occur, for example, due to manufacturing processes. The term "substantially" may be used herein to emphasize this meaning, unless the context or other statements indicate otherwise.

Unless otherwise defined, all terms (including technical and scientific terms) used herein have the same meaning as commonly understood by one of ordinary skill consistent with their meaning in the context of the relevant art and/or the present application.

Example embodiments of the inventive concepts will now be described more fully with reference to the accompanying drawings, in which example embodiments are shown.

Figure 2:
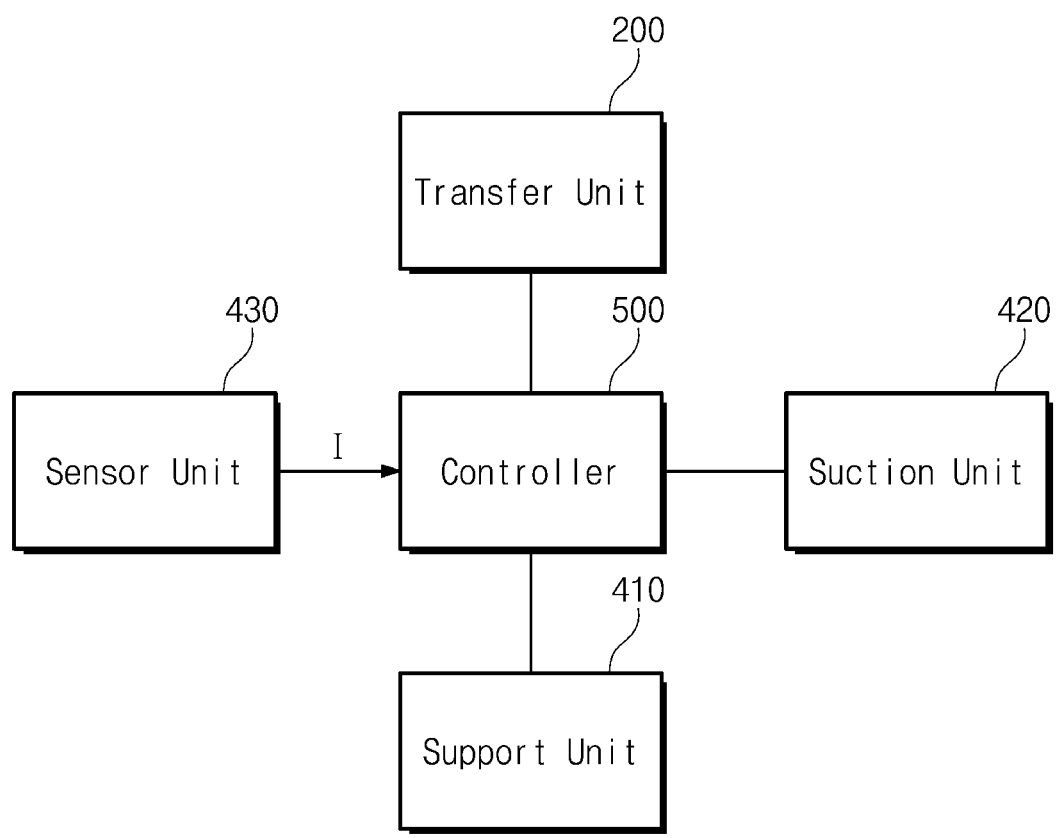
FIG. 2 is a block diagram illustrating some of constituent units of the substrate processing apparatus of FIG. 1, according to some embodiments.

FIG. 1 is a plan view illustrating a substrate processing apparatus according to some embodiments of the inventive concept. FIG. 2 is a block diagram illustrating some of constituent units of the substrate processing apparatus of FIG. 1.

Referring to FIGS. 1 and 2, a substrate processing apparatus 1 according to some embodiments of the inventive concept may include a carrier unit 10, a transfer unit 200, a substrate jig device 40, and a controller 500. The carrier unit 10 may be configured to store a plurality of substrates S therein, the transfer unit 200 may be configured to transfer the substrate S, and the substrate jig device 40 may be configured to adjust a surface flatness of the substrate S. In addition, the substrate processing apparatus 1 may further include a reaction chamber (not shown), which is used to perform a deposition or etching process on the substrate S, and a transfer rail unit 30. In some embodiments, the substrate S may be a package substrate of a semiconductor package. For example, the substrate S may be a package substrate of a fan-out wafer-level package. In certain embodiments, the substrate S may be a substrate for a display panel (e.g., LCD and OLED panels), but the inventive concept is not limited thereto. In some embodiments, the substrate S may be provided to have a rectangular shape in a plan view.

The carrier unit 10 may be an open-top structure and may be configured to store a plurality of substrates S therein. For example, the carrier unit 10 may be provided in the form of a rectangular box. The carrier unit 10 may be spaced apart from the substrate jig device 40 in a first direction X (hereinafter, an x direction).

The transfer rail unit 30 may include first and second rails 31 and 32 that are spaced apart from each other in a second direction Y (hereinafter, a y direction) crossing the first direction X. In some embodiments, the first and second directions (X, Y) may intersect perpendicularly to each other. The carrier unit 10 and/or the substrate jig device 40 may be provided between the first and second rails 31 and 32. The first and second rails 31 and 32 may have a shape elongated in the x direction X.

The transfer unit 200 may be configured to transfer the substrate S, which is stored in the carrier unit 10, to the substrate jig device 40 without contact with the substrate S (i.e., in a non-contact state). The transfer unit 200 may include at least one floating chuck 210 and at least one transfer driving unit 220.

The floating chuck 210 may be configured to hold the substrate S. For example, the floating chuck 210 may be used to hold a center region of the substrate S. The floating chuck 210 will be described in more detail with reference to FIGS. 4A and 4B.

The transfer driving unit 220 may be used to transfer the floating chuck 210 in the x direction X and/or a third direction Z (hereinafter, a z direction). In some embodiments, the third direction (Z) may be perpendicular to the first and second directions (X, Y). The transfer driving unit 220 may include a first transfer driving unit 221 and a second transfer driving unit 222 (e.g., of FIG. 3). The first transfer driving unit 221 may be configured to move along the transfer rail unit 30. For example, the first transfer driving unit 221 may include a first connection bar, which is provided to connect the first and second rails 31 and 32 to each other, and a driving motor (not shown), which is used to transfer the first connection bar along the first and second rails 31 and 32. The first connection bar may be parallel to the y direction Y. The second transfer driving unit 222 may connect the floating chuck 210 to the first transfer driving unit 221. The second transfer driving unit 222 will be described in more detail with reference to FIG. 3.

The substrate jig device 40 may be used to adjust a surface flatness of the substrate S. For example, the substrate jig device 40 may be used to prevent the substrate S from having a warpage region. For example, the jig device 40 may be configured to perform a leveling of the substrate S and/or a leveling of an upper surface of the substrate S. If a process of adjusting the surface flatness of the substrate S is finished, the substrate jig device 40 may also be used to transfer the substrate S to a reaction chamber (not shown). The substrate jig device 40 may include a support unit 410, a suction unit 420, and a sensor unit 430. The support unit 410 may be configured to support the substrate S. The support unit 410 may include a supporter 411, on which the substrate S is loaded, and a plurality of clamps 415, which are used to fasten the substrate S to the supporter 411.

The supporter 411 may be configured to support an edge region of the substrate S. The supporter 411 may be provided in the form of an approximately rectangular ring, but the inventive concept is not limited thereto. The supporter 411 may have an opening 413 penetrating a center region thereof. The opening 413 may have a shape corresponding to that of the substrate S and may have a size less than that of the substrate S. For example, the opening 413 may be provided to have an approximately rectangular shape.

In some embodiments, a plurality of the clamps 415 may be arranged along an edge of the opening 413. The clamps 415 will be described in more detail with reference to FIG. 3.

The suction unit 420 may be configured to hold the substrate S, which is transferred by the transfer unit 200, and then to place the substrate S on the support unit 410. The suction unit 420 may be used to apply a suction force to the substrate S. The suction unit 420 may include a first suction part 421 and a plurality of second suction parts 425.

The first and second suction parts 421 and 425 may overlap with the opening 413 of the support unit 410 in the z direction Z. For example, the suction parts 421 and 425 may be in the opening 413 of the support unit 410 in a plan view. For example, the first suction part 421 may overlap with a center region of the opening 413 in the z direction Z. The second suction parts 425 may overlap with an edge region of the opening 413 in the z direction Z. Here, the edge region of the opening 413 may be a region extended from the edge of the opening 413 toward the center of the opening 413 by a specific distance. Furthermore, the z direction may be a vertical (i.e., upward or downward) direction.

The first suction part 421 may be spaced apart from the second suction parts 425. The second suction parts 425 may be arranged along the edge region of the opening 413. The second suction parts 425 may be provided to surround the first suction part 421. The second suction parts 425 may be spaced apart from each other. The first and second suction parts 421 and 425 will be described in more detail with reference to FIG. 3.

The sensor unit 430 may include a first sensor unit 431, which is used to measure level positions of the first and second suction parts 421 and 425, and a second sensor unit 435, which is used to measure surface flatness of the substrate S. Here, the level position may be a position in the z direction Z, and the level position may be measured by the first sensor unit 431. The surface flatness may be defined to represent how flat the substrate S is.

The first sensor unit 431 may include a light emitting part 431a and a light receiving part 431b. The light emitting part 431a and the light receiving part 431b may be spaced apart from each other in the y direction Y. This will be described in more detail with reference to FIG. 3.

The second sensor unit 435 may include a level sensor 435a and a sensor transfer part 435b, which is used to transfer the level sensor 435a.

The sensor transfer part 435b may be configured to transfer the level sensor 435a in the x direction X. In certain embodiments, the sensor transfer part 435b may be configured to transfer the level sensor 435a in the x direction X and/or the y direction Y. For example, by using the sensor transfer part 435b, a position of the level sensor 435a may change over the support unit 410. For example, the level sensor 435a may be configured to move over the support unit 410, e.g., in the directions x and/or y.

The sensor transfer part 435b may include a second connection bar, which is provided to connect the first and second rails 31 and 32 to each other, and a driving motor (not shown), which is used to transfer the second connection bar in the x direction X.

The level sensor 435a may be configured to measure surface flatness of the substrate S. The level sensor 435a may be configured to transmit flatness information, which is measured from the substrate S, to the controller 500. This will be described in more detail with reference to FIG. 3.

The controller 500 may be configured to control the substrate jig device 40 and the transfer unit 200. The controller 500 may receive measurement information I transmitted from the sensor unit 430. The measurement information I may contain information regarding surface flatness of the substrate S and/or level positions of the first and second suction parts 421 and 425. Based on the measurement information I, the controller 500 may control the substrate jig device 40 and/or the transfer unit 200. This will be described in more detail below.

Figure 4A:
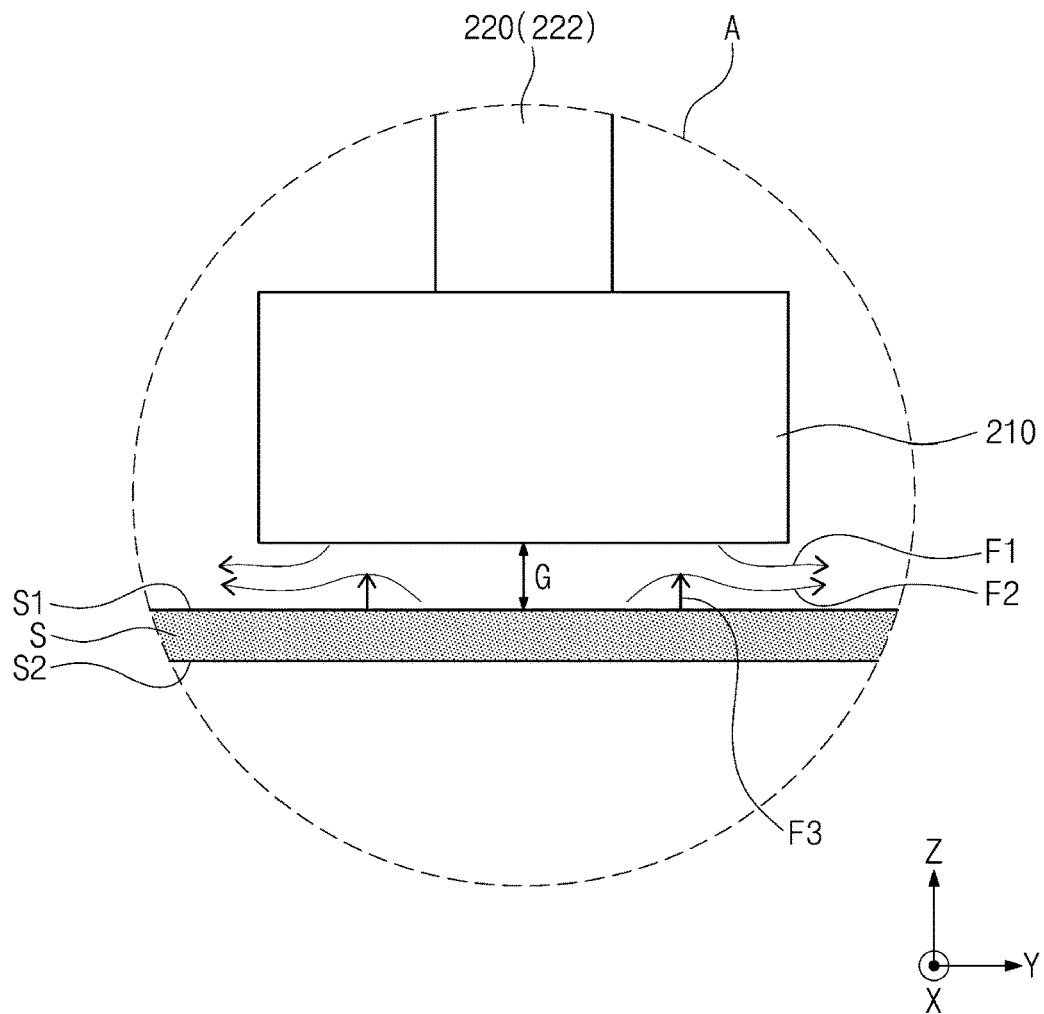
FIG. 4A is an enlarged view of a portion A of FIG. 3.
Figure 4B:
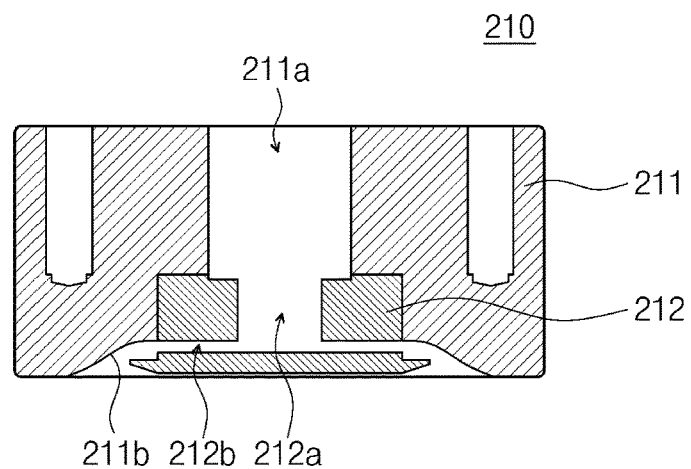
FIG. 4B is a sectional view of a floating chuck of FIG. 3, according to some embodiments.

FIG. 3 is a schematic diagram illustrating the substrate processing apparatus of FIG. 1. FIG. 4A is an enlarged view of a portion A of FIG. 3. FIG. 4B is a sectional view of a floating chuck of FIG. 3.

Referring to FIGS. 1 to 3 and FIGS. 4A and 4B, the transfer unit 200 may include the floating chuck 210 and the transfer driving unit 220.

The floating chuck 210 may be configured to supply a compressed air onto a first surface S1 of the substrate S and thereby generate negative pressure between the first surface S1 of the substrate S and the floating chuck 210. This may be helpful for the floating chuck 210 to hold the first surface S1 of the substrate S in a non-contact state. In the present embodiment, the first surface S1 of the substrate S may be a top surface of the substrate S. A second surface S2 facing the first surface S1 of the substrate S may be a bottom surface of the substrate S.

The floating chuck 210 may include a main body 211, an air guide 212 coupled to a lower portion of the main body 211, and an air supplying part (not shown) configured to supply a compressed air.

The main body 211 may have a supply hole 211a, which is formed at a center region thereof and allows the compressed air to flow therethrough. A bottom surface of the main body 211 may include a diffusion surface 211b that is inclined downwardly and outwardly from a bottom of the supply hole 211a.

The air guide 212 may have a first flow hole 212a and a plurality of second flow holes 212b. The first flow hole 212a may be provided at its center region and may be connected to the supply hole 211a, and the second flow holes 212b may be formed to extend outward from the first flow hole 212a. For example, the second flow holes 212b may extend in a radial direction from the first flow hole 212a.

If a compressed air is supplied to the main body 211 through the supply hole 211a, the compressed air may pass through the first flow hole 212a, the second flow holes 212b, and the diffusion surface 211b and may be exhausted to the outside of the main body 211 through the bottom surface of the main body 211 to form a first air flow F1 of FIG. 4A. In the case where the compressed air is exhausted from the main body 211 in an outward direction, a part of the air between the floating chuck 210 and the first surface S1 of the substrate S may form a second air flow F2 shown in FIG. 4A, owing to Bernoulli Effect. The first and second air flows F1 and F2 may be joined with each other near the diffusion surface 211b and then may flow in the outward direction. This may be helpful to generate negative pressure between the floating chuck 210 and the first surface S1 of the substrate S and to exert a suction force (e.g., see F3 of FIG. 4A) onto the first surface S1 of the substrate S in a direction toward the floating chuck 210. For example, the negative pressure between the floating chuck 210 and the first surface S1 may be helpful to lift up the substrate S against the force of gravity. Here, the first surface S1 of the substrate S may be spaced apart from the bottom of the floating chuck 210 to form a gap G therebetween, and the gap G may be preserved during the step of supplying the compressed air. For example, the floating chuck 210 may be used to hold the first surface S1 of the substrate S in a non-contact state.

The transfer driving unit 220 may include the first and second transfer driving units 221 and 222. The second transfer driving unit 222 may be configured to lift up or down the floating chuck 210 in the z direction Z. The second transfer driving unit 222 may be a hydraulic or pneumatic cylinder.

The suction unit 420 may be configured to hold the substrate S, which is transferred by the transfer unit 200, and then to place the substrate S on the support unit 410. The first suction part 421 may be used to hold the center region of the substrate S. The second suction parts 425 may be used to hold the warpage region of the substrate S. For example, when the center region of the substrate S is held by the first suction part 421, the edge region of the substrate S may be bent downward by gravity. The edge region of the substrate S may be held by the second suction parts 425. If the substrate S is held by the first and second suction parts 421 and 425, the first and second suction parts 421 and 425 may be driven to dispose the substrate S on the supporter 411 of the support unit 410.

The first suction part 421 may include a first suction pad 421a and first pad driving parts 421b and 421c. Each of the second suction parts 425 may include a second suction pad 425a and second pad driving parts 425b and 425c.

The first and second suction pads 421a and 425a may be used to hold at least one of the first and second surfaces S1 and S2 of the substrate S. In some embodiments, the first and second suction pads 421a and 425a may be used to hold the second surface S2 of the substrate S. For example, the first and second suction pads 421a and 425a may hold the second surface S2 of the substrate S using the same method as that of the floating chuck 210 described above. In certain embodiments, the first and second suction pads 421a and 425a may be configured to apply negative pressure to the substrate S (e.g., by using a vacuum chuck), which is different from applying the negative pressure between the substrate and the floating chuck 210. Accordingly, the first and second suction pads 421a and 425a may be in contact with the substrate S, when the substrate S is held by the first and second suction pads 421a and 425a. As shown in FIG. 3, when the first suction pad 421a is used to hold the substrate S, the first suction pad 421a may be provided to face the floating chuck 210.

The first pad driving parts 421b and 421c may be used to change a position of the first suction pad 421a. The first pad driving parts 421b and 421c may include a first lifting part 421b which is used to change a vertical position of the first suction pad 421a.

The second pad driving parts 425b and 425c may be used to change a position of the second suction pad 425a. The second pad driving parts 425b and 425c may include a second lifting part 425b which is used to change a vertical position of the second suction pad 425a. In some embodiments, each of the first and second lifting parts 421b and 425b may be used to lift up or down the first and second suction pads 421a and 425a in the z direction Z.

Each of the first and second lifting parts 421b and 425b may be a hydraulic or pneumatic cylinder, but the inventive concept is not limited thereto. The first and second lifting parts 421b and 425b may include a linear scale (not shown) provided on its outer side surface. The linear scale may be provided parallel to the lifting direction (e.g., the z direction Z) of the first and second lifting parts 421b and 425b. The linear scale may be configured to represent information regarding positions, in the z direction, of the first and second suction pads 421a and 425a (hereinafter, Z position information).

The first pad driving parts 421b and 421c may include a driving motor 421c that is used to transfer the first suction pad 421a in at least one of the x and y directions. The second pad driving parts 425b and 425c may include a driving motor 425c that is used to transfer the second suction pad 425a in at least one of the x and y directions. For example, the driving motors 421c and 425c may be respectively configured to move the first suction pad 421a and the second suction pad 425a in x, y and radial directions, and opposite directions thereof, e.g., on a plane parallel to a top surface of the first suction pad 421*a* and/or a bottom surface of the floating chuck 210.

The first sensor unit 431 may be provided above and/or below the support unit 410. As described above, the first sensor unit 431 may include the light emitting part 431*a* (e.g., a light emitting sensor component) and the light receiving part 431*b* (e.g., a light receiving sensor component). The light emitting part 431*a* may be configured to emit a laser light L1. The laser light L1 may pass through the first and second suction parts 421 and 425 and then may be incident into the light receiving part 431*b*. For example, the first sensor unit 431 may be used to obtain the Z position information of the first and second suction parts 421 and 425. For example, the first sensor unit 431 may be used to obtain the Z position information of the first and second suction pads 421*a* and 425*a*. The Z position information obtained by the first sensor unit 431 may be transmitted to the controller 500.

A level sensor 435*a* may be spaced apart from the support unit 410 in the upward direction. The sensor transfer part 435*b* may be used to change a position of the level sensor 435*a* over the support unit 410. The level sensor 435*a* may be a laser sensor, an ultrasonic wave sensor, and so forth. For example, the level sensor 435*a* may be configured to emit laser light toward the first surface S1 of the substrate S. The level sensor 435*a* may be configured to receive a fraction of the laser light reflected by the substrate S. For example, the level sensor 435*a* may be used to measure surface flatness of the substrate S. The level sensor 435*a* may transmit information regarding a difference in time between the emitting and receiving of the laser light to the controller 500.

The clamps 415 of the support unit 410 may be provided on the supporter 411. The clamps 415 may include a gripping part 415*a* and a hinge axis 415*b*, and here the hinge axis 415*b* may be connected to an end of the gripping part 415*a*. The gripping part 415*a* may be configured to rotate about the hinge axis 415*b*. For example, in the case where the substrate S is positioned on the supporter 411, the gripping part 415*a* may be configured to rotate in a direction toward the substrate S. Accordingly, the clamps 415 may grip an edge region of the substrate S, and thus, the substrate S may be fastened to the support unit 410.

The controller 500 may control the first and second pad driving parts 421*b*, 421*c*, 425*b*, and 425*c*, based on the Z position information transmitted from the first sensor unit 431. For example, the controller 500 may control positions, in the z direction Z, of the first and second suction pads 421*a* and 425*a* according to the position information coming from the first sensor unit 431.

In the controller 500, the information regarding the light-receiving time transmitted from the second sensor unit 435 may be used to calculate surface flatness of the substrate S. For example, based on the information regarding the light-receiving time and the light speed, the controller 500 may be used to calculate a distance between the level sensor 435*a* and the substrate S. The controller 500 may compare the calculated distance with a predetermined criteria range. If the calculated distance of a measured region is beyond the criteria range, the controller 500 may regard the measured region of the substrate S as the warpage region. The controller 500 may control the second pad driving parts 425*b* and 425*c* to transfer the second suction pad 425*a* to the warpage region.

Under the control of the controller 500, the clamps 415 may be operated to grip the substrate S. For example, in the case where the substrate S has a flat shape on the support unit 410, the gripping part 415*a* may be rotated toward the substrate S, under the control of the controller 500.

Figure 6:
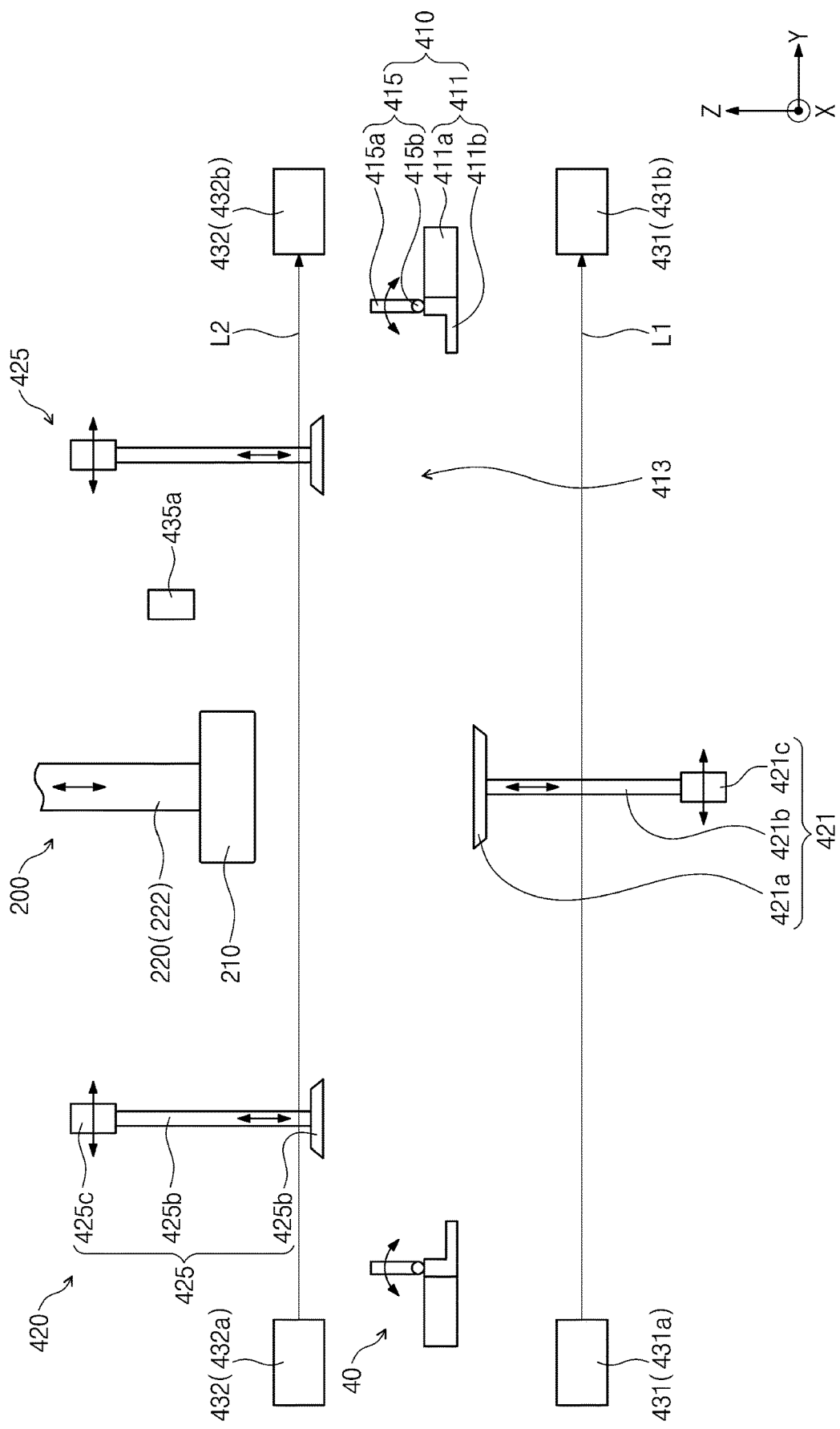

FIGS. 5 and 6 are schematic diagrams illustrating modified examples of the substrate processing apparatus of FIG. 1. For concise description, an element previously described with reference to FIGS. 1 to 4B may be identified by a similar or identical reference number without repeating an overlapping description thereof.

Referring to FIG. 5, the second pad driving parts 425*b*, 425*c*, and 425*d* may further include a pivotal part 425*d*, which is used to rotate the second suction pad 425*a*, unlike the second pad driving parts 425*b* and 425*c* of FIG. 3. For example, the pivotal part 425*d* may be connected to a lower portion of the second lifting part 425*b*. The pivotal part 425*d* may be configured to rotate the second lifting part 425*b* about the lower portion of the second lifting part 425*b*. Accordingly, the second suction pad 425*a* may be rotated about the lower portion of the second lifting part 425*b*.

Referring to FIG. 6, the second suction parts 425 of FIG. 6 may be positioned above the supporter 411 of the support unit 410, unlike the second suction parts 425 of FIG. 3. The sensor unit 430 may further include a third sensor unit 432. The third sensor unit 432 may be positioned above the support unit 410. The third sensor unit 432 may include a light emitting part 432*a* and a light receiving part 432*b*. The light emitting part 432*a* may be configured to emit a laser light L2. The laser light L2 may pass through the second suction parts 425, which is positioned above the supporter 411 of the support unit 410, and then may be incident into the light receiving part 432*b*. For example, the third sensor unit 432 may be used to obtain the Z position information of the second suction parts 425. The Z position information obtained by the third sensor unit 432 may be transmitted to the controller 500.

The second suction parts 425 may be positioned in such a way that they overlap with the edge of the substrate S disposed on the support unit 410. For example, the second suction parts 425 may be positioned to overlap with a supporting part 411*a* of the supporter 411. For example, when the warpage region is formed at the edge of the substrate S, the second suction pads 425*a* may be transferred toward the edge of the substrate S by the second pad driving parts 425*b* and 425*c*. The second suction pads 425*a* may be used to apply a suction force to the warpage region at the edge of the substrate S. Accordingly, the warpage region at the edge of the substrate S may be made flat.

The following is provided to describe a process of operating the substrate processing apparatus according to some embodiments of the inventive concept.

FIGS. 7A to 7G are schematic diagrams that are presented to describe a process of operating the substrate processing apparatus of FIG. 1.

Referring to FIG. 7A, the transfer unit 200 may be disposed over the carrier unit 10. The floating chuck 210 of the transfer unit 200 may be transferred toward the first surface S1 of the substrate S. For example, the floating chuck 210 may be transferred in a downward direction. For example, the transfer unit 200 may move above the carrier unit 10, e.g., a carrier of the substrate S, and then the floating chuck 210 of the transfer unit 200 may move down to the substrate S to hold the substrate S, e.g., the first surface S1 of the substrate S. For example, the transfer unit 200 may be a transferor of the substrate S.

A compressed air may be supplied onto the first surface S1 of the substrate S through the floating chuck 210. Accordingly, negative pressure may be generated between the floating chuck 210 and the first surface S1 of the substrate S. Due to the negative pressure between the floating chuck 210 and the first surface S1 of the substrate S, the floating chuck 210 may be used to hold the substrate S, which is stored in the carrier unit 10, in a non-contact state. For example, the floating chuck 210 may hold the center region of the first surface S1 of the substrate S. For example, the floating chuck 210 may use Bernoulli Effect to hold the substrate S.

The floating chuck 210 and the substrate S held thereby may be transferred in an upward direction. In this step, the edge region of the substrate S may be bent downward by gravity. For example, the substrate S may have a warpage region at its edge region. The transfer unit 200 may transfer the substrate S to the support unit 410. For example, the transfer unit 200 may transfer the substrate S in the x direction X. For example, the transfer unit 200 may hold the substrate S from the carrier unit 10, and then the transfer unit 200 may move the substrate S to the support unit 410 having a supporter 411 for the substrate S.

Figure 7B:
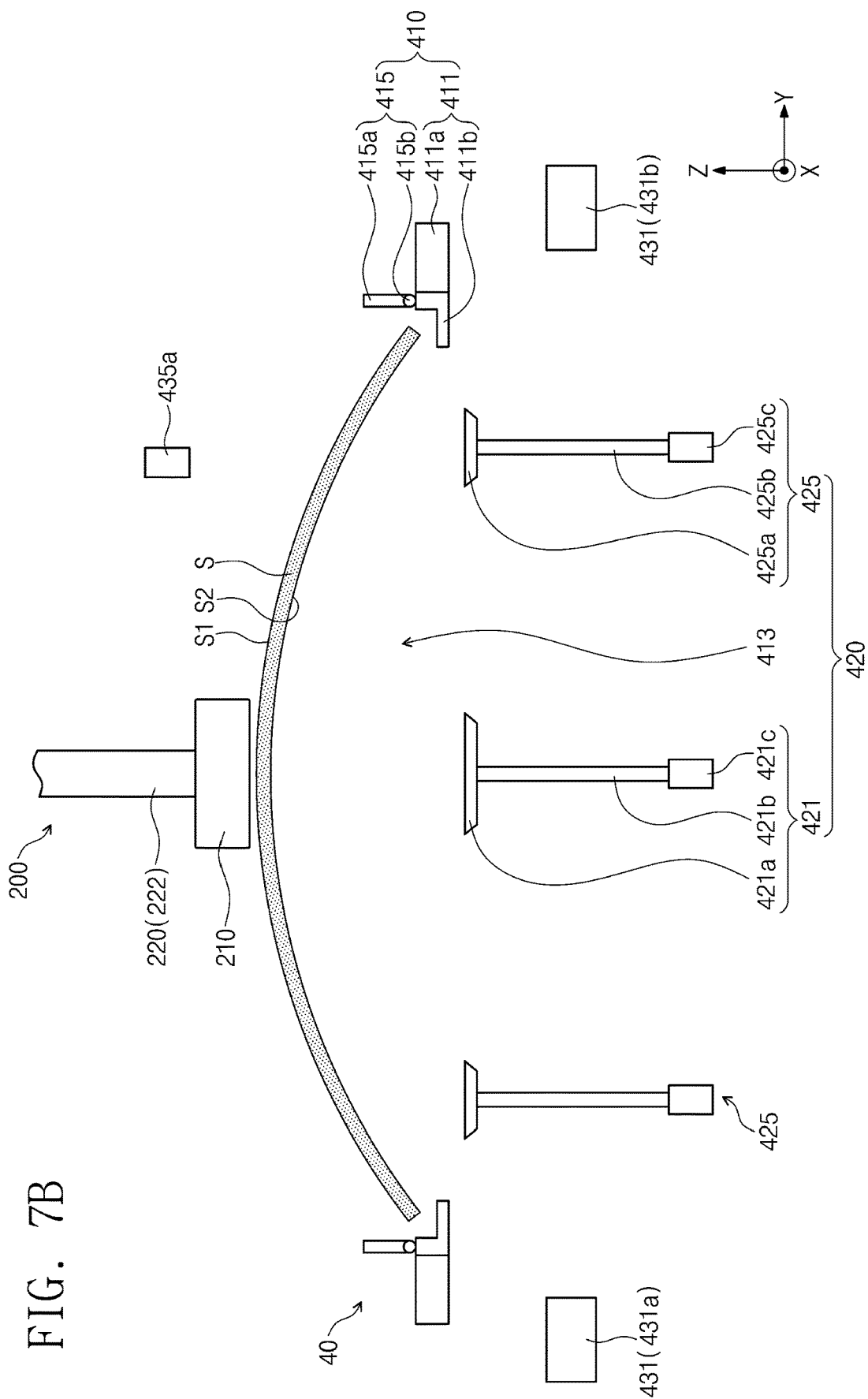

Referring to FIG. 7B, the transfer unit 200 may be used to place the substrate S on the support unit 410. Here, the substrate S may be spaced apart upward from the support unit 410. The floating chuck 210 of the transfer unit 200 may be positioned to face the first suction pad 421a of the first suction part 421. For example, when the transfer unit 200 moves the substrate S to the support unit 410, the transfer unit 200 may hold the substrate S over the support unit 410 so that a plurality of suction pads including the first suction pad 421a may be disposed under the substrate S. For example, the plurality of suction pads and/or the support unit 410 may form a receiver of the substrate S.

Figure 7C:
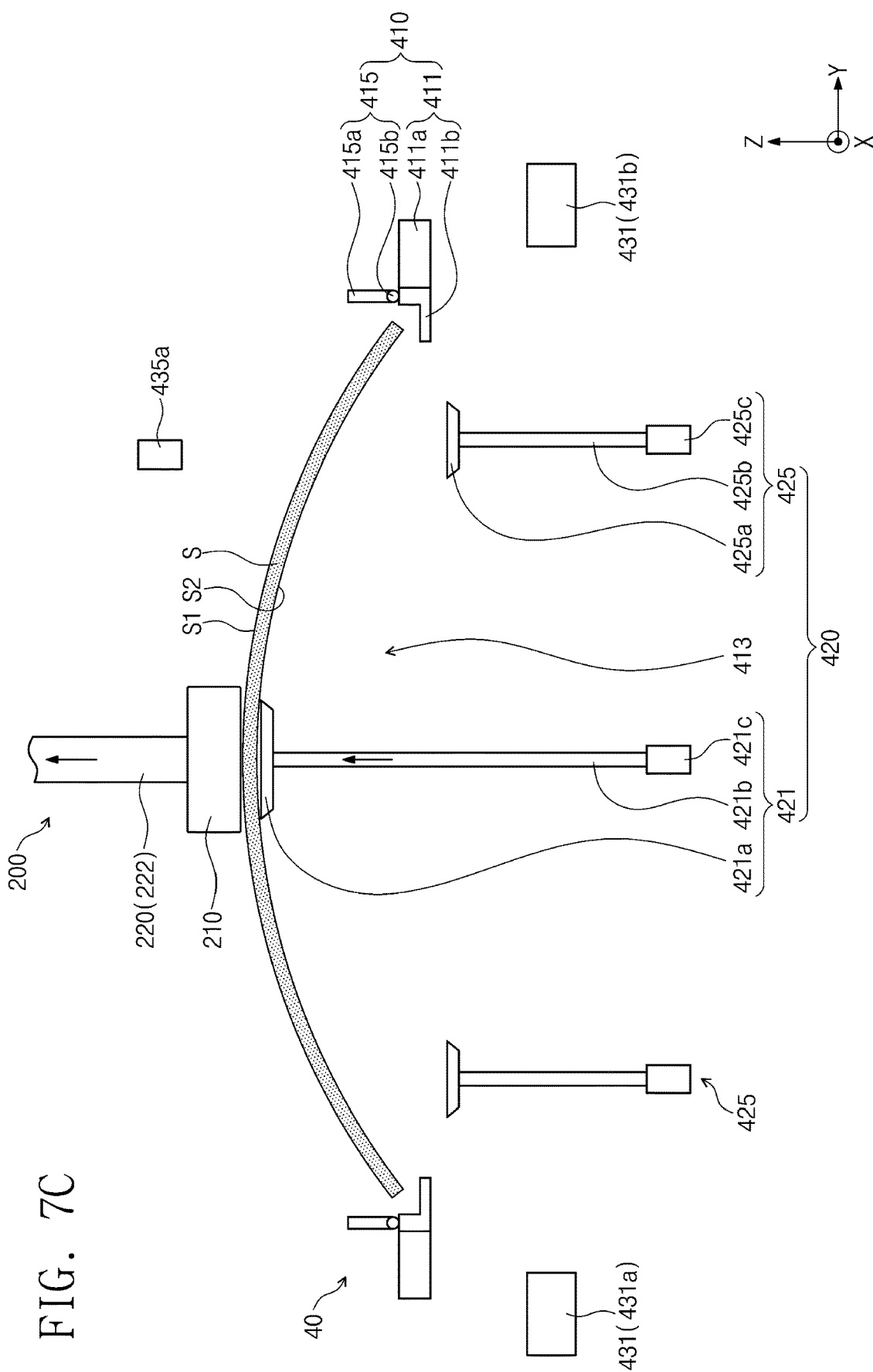

Referring to FIG. 7C, the first pad driving parts 421b and 421c may transfer the first suction pad 421a toward the substrate S. For example, the first pad driving parts 421b and 421c may transfer the first suction pad 421a in the upward direction. The first suction pad 421a may be used to supply compressed air toward the second surface S2 of the substrate S. Accordingly, negative pressure may be generated between the first suction pad 421a and the second surface S2 of the substrate S. Due to the negative pressure between the first suction pad 421a and the second surface S2 of the substrate S, the first suction pad 421a may be used to hold the second surface S2 of the substrate S in a non-contact state. In certain embodiments, the receiver of the substrate S may include a plurality of supporting rods instead of the plurality of suction pads. In this case, the rods may be operated to be the same as below described operation of the suction pads other than suctioning the substrate S. The supporting rods may extend vertically (z direction) to support the substrate S, and may move upward (z direction) to receive the substrate S. For example, the plurality of suction pads may be vacuum pads or floating pads, and the vacuum pads may contact the substrate S while the floating pads may not contact the substrate S. For example, the supporting rods may contact the substrate S similarly to the vacuum pads.

The exhaust of the compressed air through the floating chuck 210 may be stopped. Accordingly, the floating chuck 210 may no longer apply the suction force to the first surface S1 of the substrate S. The transfer unit 200 may move toward the carrier unit 10 (e.g., of FIG. 1). For example, the floating chuck 210 may move above the carrier unit 10 after the floating chuck 210 releases the substrate S on the suction pad and/or the receiver.

Figure 7D:
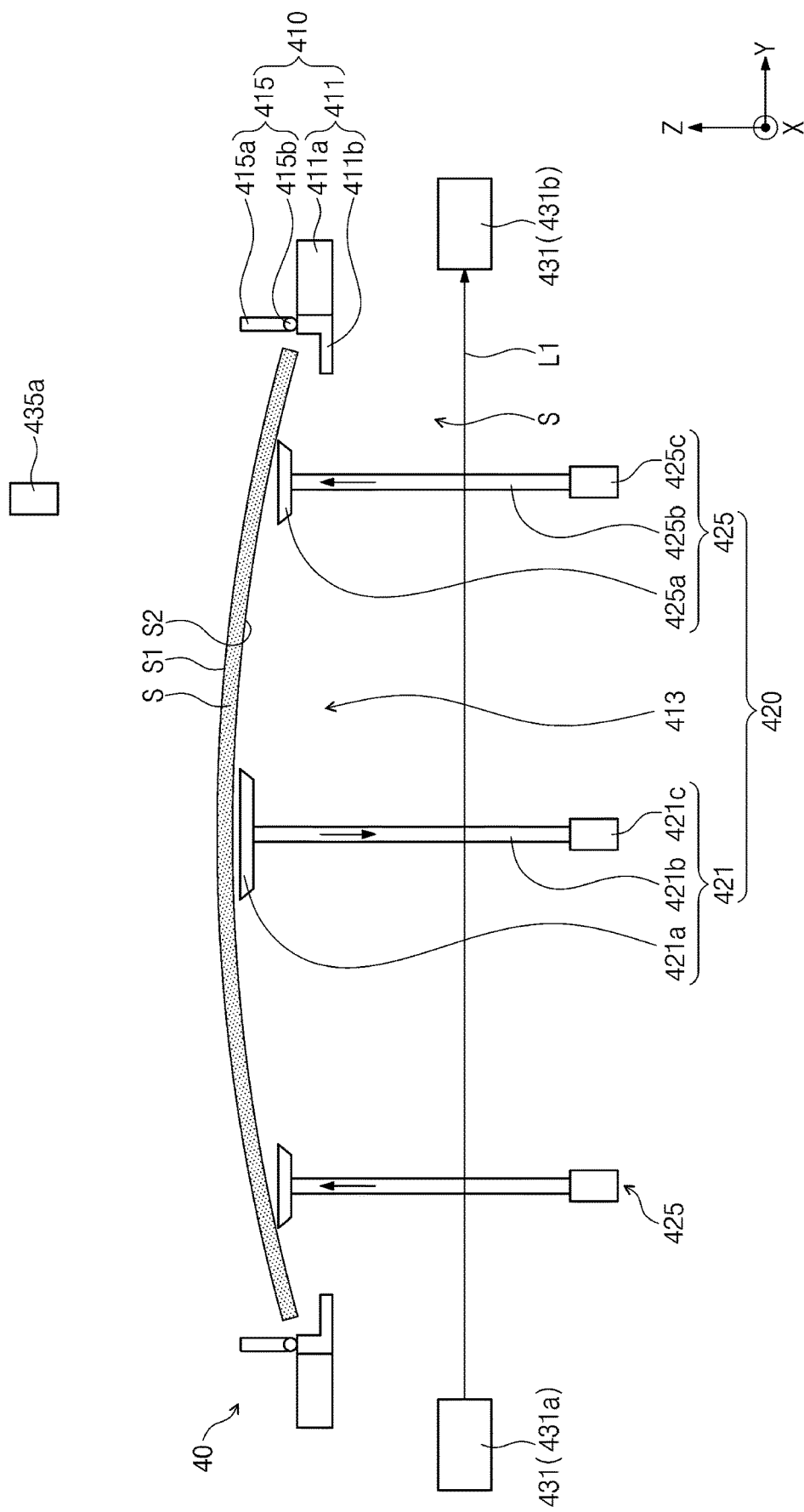

Referring to FIG. 7D, the first pad driving parts 421b and 421c may transfer the first suction pad 421a toward the support unit 410. For example, the first pad driving parts 421b and 421c may transfer the first suction pad 421a in the downward direction. For example, at least one of the suction pads or the supporting rods that receives the substrate S, may move downward along with the substrate S to the support unit 410 after the release of the substrate S from the floating chuck 210.

The second pad driving parts 425b and 425c may transfer the second suction pad 425a toward the substrate S. For example, the second pad driving parts 425b and 425c may transfer the second suction pad 425a in the upward direction. The second suction pad 425a may hold the second surface S2 of the substrate S. For example, when the substrate S is transferred downward by the first suction part 421, the second suction pad 425a may hold the second surface S2 of the substrate S. Thus, the first and second suction pads 421a and 425a may hold the second surface S2 of the substrate S. The second suction pad 425a may hold the warpage region of the substrate S. When the second suction pad 425a holds the warpage region of the substrate S, the first suction pad 421a may be positioned at a higher level than that of the second suction pad 425a. For example, the suction pads and/or supporting rods corresponding to edge portions of the substrate S may support warpage portions of the substrate S.

The first suction part 421 may be used to hold and transfer the center region of the substrate S in the downward direction, and the second suction parts 425 may be used to hold and transfer the warpage region of the substrate S in the upward direction. For example, the second suction parts 425 may move upward simultaneously while the first suction part 421 moves downward. In certain embodiments, the first suction part 421 may move downward while the second suction parts 425 stay stationary. In some other embodiments, the second suction parts 425 may move upward while the first suction part 421 moves downward. In certain embodiments, after the second suction parts 425 reach the substrate S, the first suction part 421 may move downward at a first speed while the second suction parts 425 move downward at a second speed different from the first speed until the heights of the first suction part 421 and the second suction parts 425 reach at the same height.

The first sensor unit 431 may be used to measure positions, in the z direction, of the first and second suction pads 421a and 425a. For example, the first sensor unit 431 may measure heights of multiple suction pads 421a and 425a. In certain embodiments, the first sensor unit 431 may include multiple sensors each of which may measure a height of a corresponding suction pad 421a or 425a. In some embodiments, the first sensor unit 431 is a sensor that includes a transmitter component (e.g., 431a) and a receiver component (e.g., 431b). The controller 500 may control the first and second lifting parts 421b and 425b, based on the z position information measured by the first sensor unit 431. For example, the first and second lifting parts 421b and 425b may be driven in such a way that the first and second suction pads 421a and 425a are positioned at substantially the same level in the z direction Z. Accordingly, the substrate S suctioned by the first and second suction pads 421a and 425a may have a substantially flat shape. The first and second lifting parts 421b and 425b may transfer the first and second suction pads 421a and 425a in the downward direction so as to dispose the substrate S on a supporting part 411b of the supporter 411. For example, the plurality of the suction pads and/or the supporting rods may move the substrate S to the supporter 411 after the plurality of the suction pads and/or the supporting rods receive the substrate S.

Figure 7E:
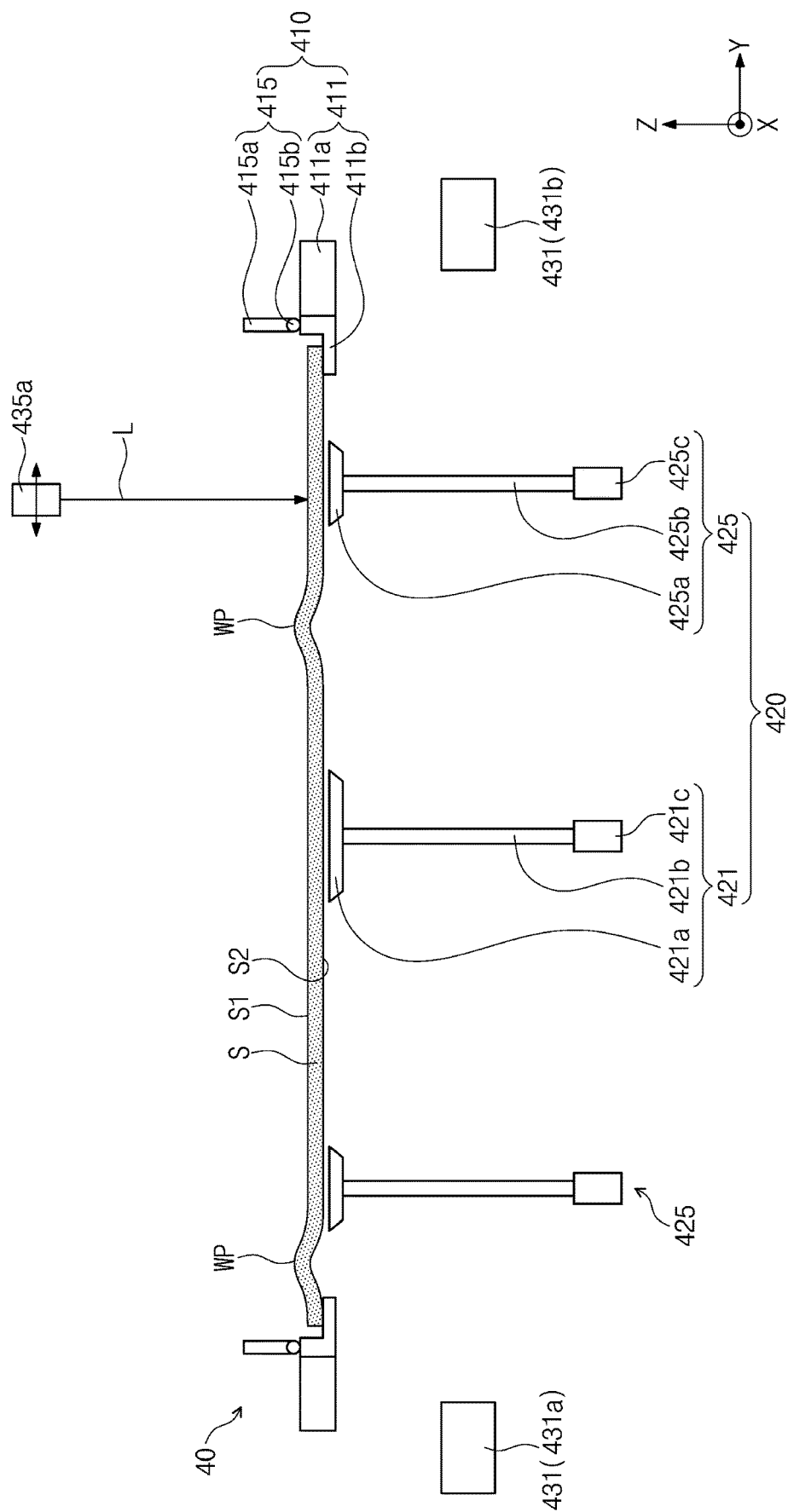

Referring to FIGS. 1 and 7E, when the substrate S is disposed on the supporting part 411b, the second sensor unit 435 may measure surface flatness of the substrate S. For example, the level sensor 435a may be transferred to a position over the substrate S and then may measure the surface flatness of the substrate S at a warpage region WP. For example, the level sensor 435a may measure heights of a plurality of regions of the upper surface of the substrate S for the controller to determine a warpage region of the substrate S.

Figure 7F:
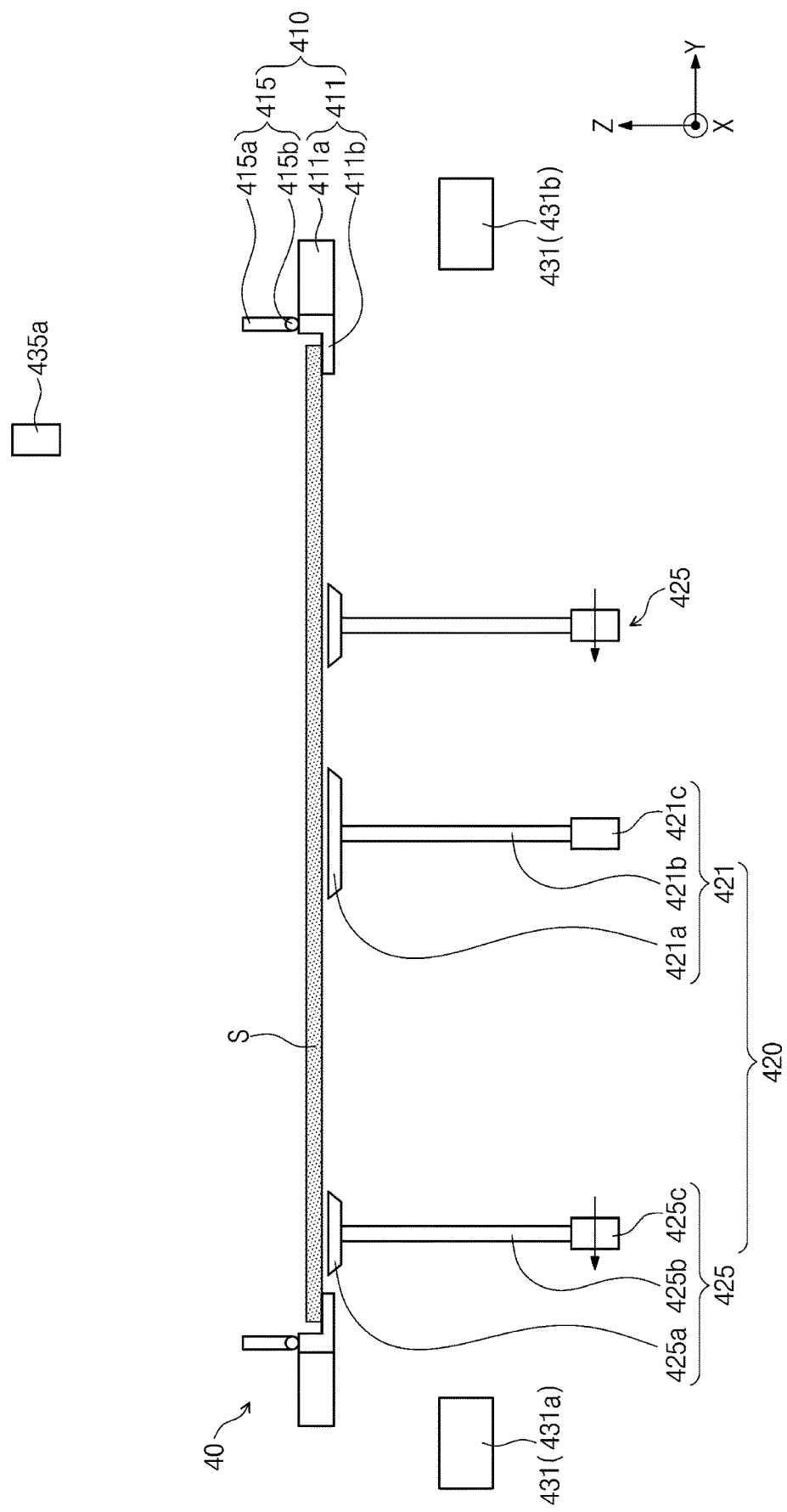

Referring to FIG. 7F, the second pad driving parts 425b and 425c may transfer the second suction pad 425a toward the warpage region WP of the substrate S. Then, the second suction pad 425a may apply a suction force to the warpage region WP. Accordingly, the substrate S may have a substantially flat shape. For example, the surface flatness of the substrate S may be improved by a suction force of the suction pad 425a. In certain embodiments, after the measurement of the flatness and determining the warpage regions, the second suction pads and/or supporting rods may move to warpage regions to support the warpage regions such that the warpage regions may be substantially flattened.

Figure 7G:
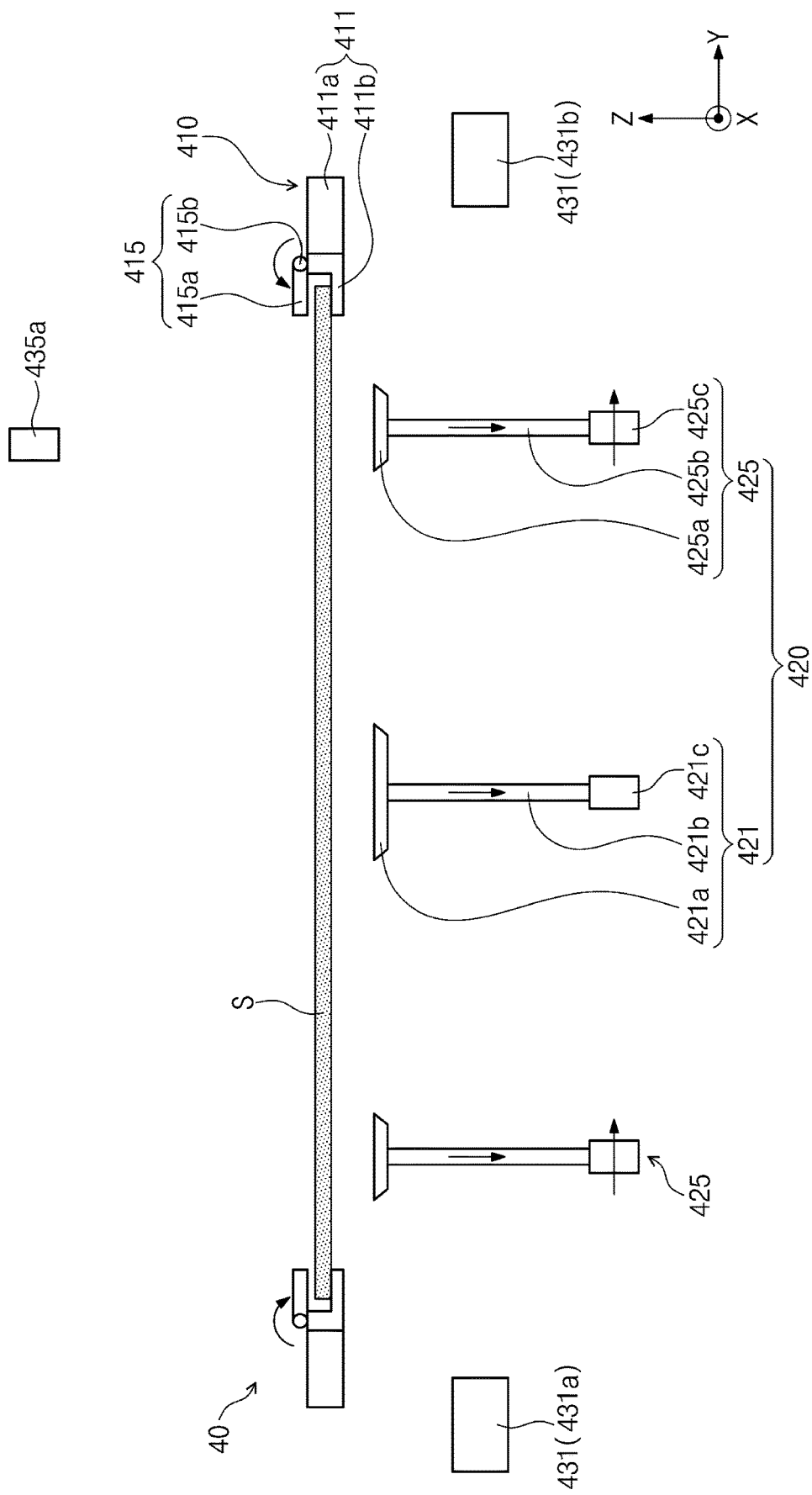

Referring to FIG. 7G, the first and second suction pads 421a and 425a may stop applying the suction force to the second surface S2 of the substrate S. For example, the first and second pad driving parts 421b, 421c, 425b, and 425c may transfer the first and second suction pads 421a and 425a in the downward direction (e.g., to a position below the support unit 410).

The gripping part 415a of the clamp 415 may be rotated about the hinge axis 415b to grip the edge of the substrate S. Accordingly, the substrate S may be fastened to the support unit 410. For example, FIG. 7G shows that the gripping parts 415a do not contact the substrate S. However, in certain embodiments, the gripping parts contact and/or fasten the substrate S. For example, the gripping part 415a may grip the edge of the substrate S before or after the release of the substrate S from the suction pads 421a and 425a, and/or the supporting rods (not shown).

A method of operating the substrate processing apparatus described herewith (above and below) may include manufacturing methods of semiconductor packages—for example, transferring substrates before or after certain manufacturing steps such as forming circuit layers or structures on the substrate. For example, the structures formed on the substrate may include fan-out wafer level packaging structures and fan-out panel level packaging structures. For example, the fan-out wafer level packaging structures and/or the fan-out panel level packaging structures may be formed on the substrate after the substrate is flattened and/or after the substrate is clamped by a plurality of clamps.

Figure 8A:
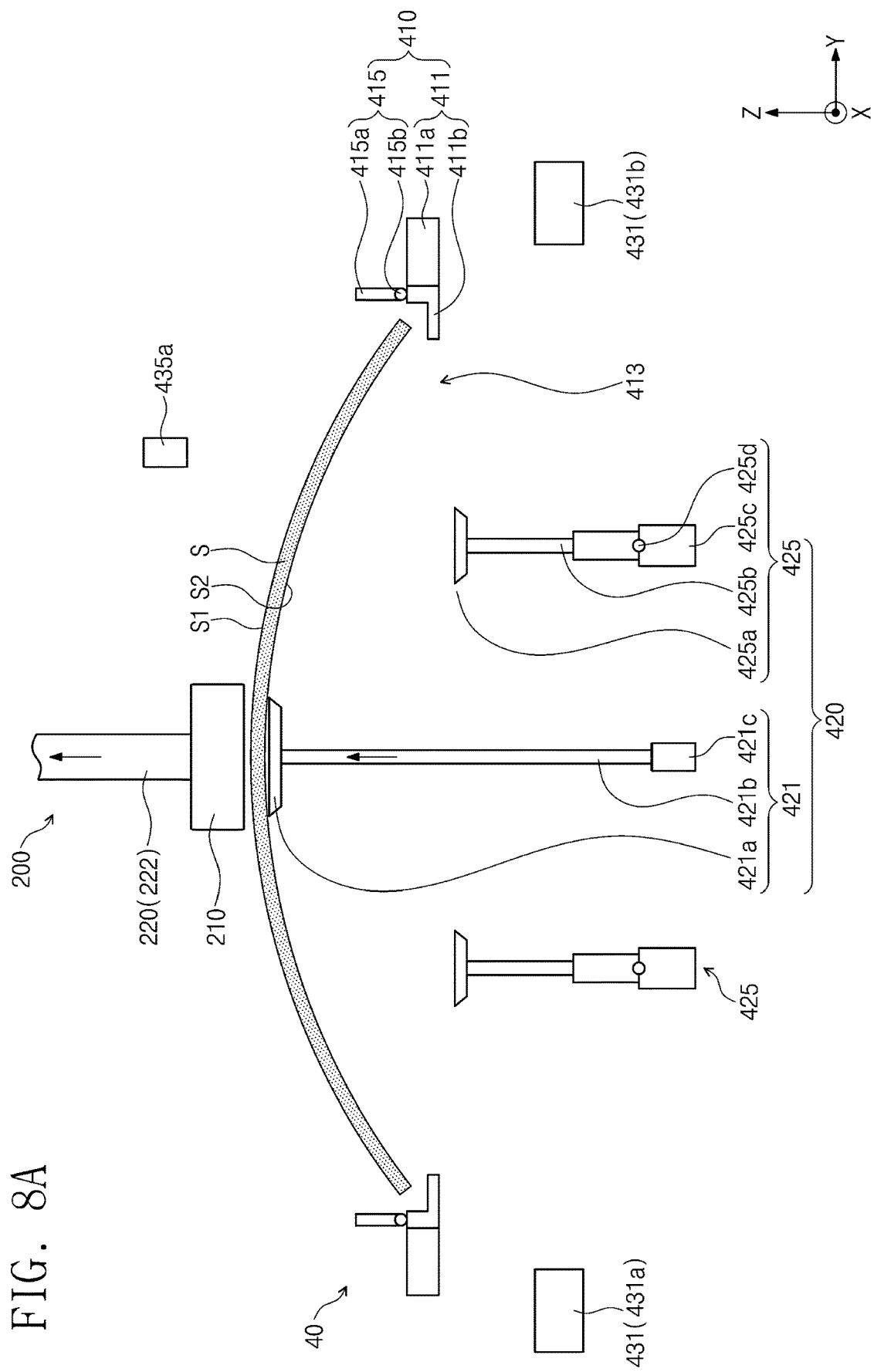
Figure 8C:
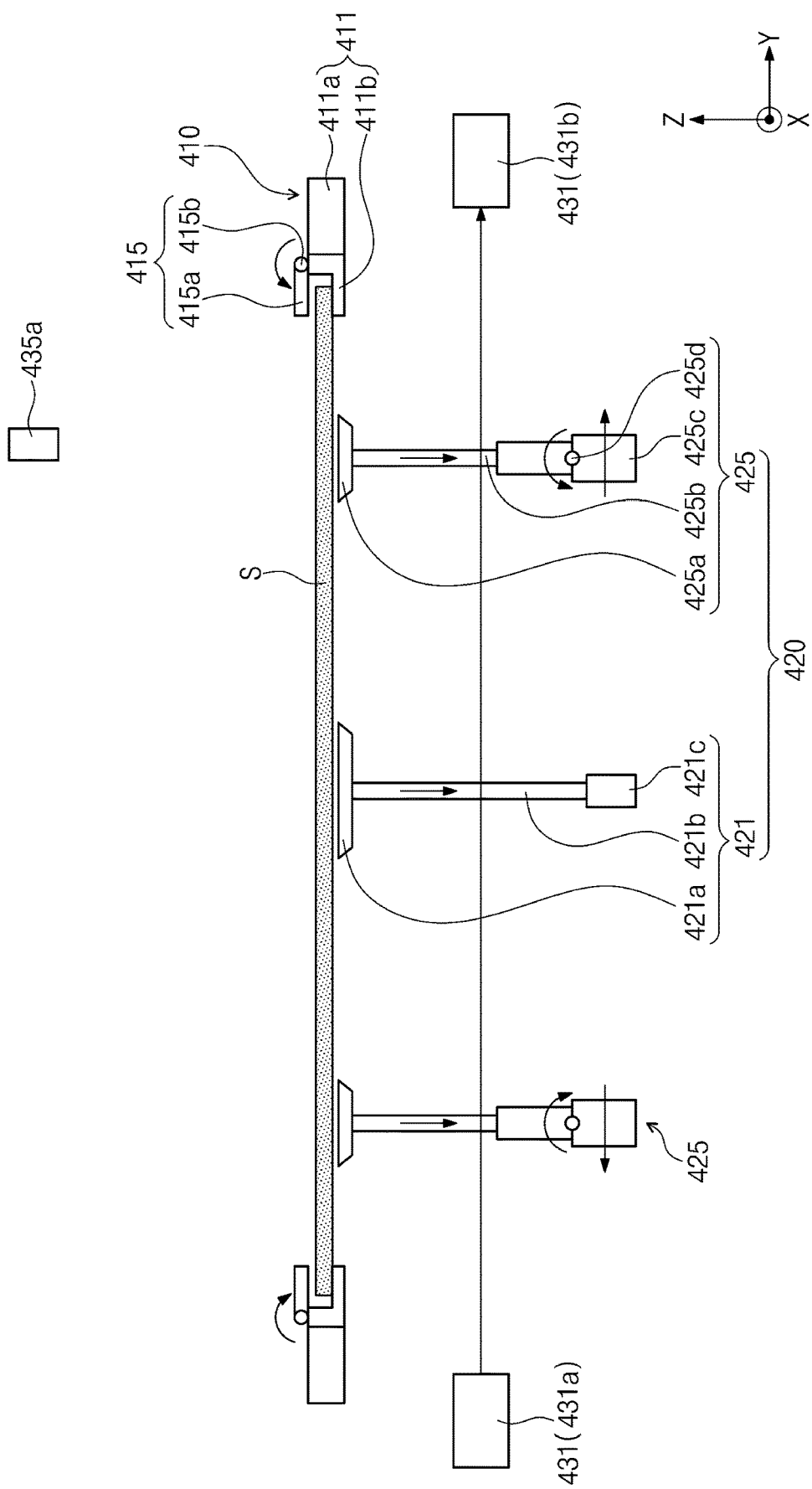

FIGS. 8A to 8C are schematic diagrams that are presented to describe a process of operating the substrate processing apparatus of FIG. 5. The operation process described with reference to FIGS. 7A, 7B, and 7C may also be used to describe the operation of the substrate processing apparatus 1 of FIG. 5. For the sake of brevity, the elements that are the same as or similar to those previously shown and described may not be described again.

Referring to FIG. 8A, the first pad driving parts 421b and 421c may transfer the first suction pad 421a toward the substrate S. For example, the first lifting part 421b may be used to transfer the first suction pad 421a in the upward direction. The first suction pad 421a and the floating chuck 210 may be provided to face each other with the substrate S interposed therebetween. The first suction pad 421a may apply vacuum pressure to the second surface S2 of the substrate S. Accordingly, the second surface S2 of the substrate S may be in contact with the first suction pad 421a, when it is held by the first suction pad 421a.

The floating chuck 210 may be operated in such a way that the suction force is no more applied to the first surface S1 of the substrate S, e.g., after the first suction pad 421a applies suction force (either a vacuum force or a non-contact suction force) to the second surface S2 of the substrate S. For example, the floating chuck 210 may release the substrate S from its holding after at least one of the suction pads 421a and 425a or the supporting rods exert a force on the substrate. The transfer unit 200 may be transferred in the upward direction, e.g., after the floating chuck 210 releases the substrate S. Then, the transfer unit 200 may be transferred toward the carrier unit 10 (e.g., of FIG. 1).

Referring to FIG. 8B, the first pad driving parts 421b and 421c may be used to transfer the first suction pad 421a and the substrate S held thereby toward the support unit 410. For example, the first lifting part 421b may be used to transfer the first suction pad 421a holding the second surface S2 of the substrate S, in the downward direction. For example, the plurality of suction pads 421a and 425a or the supporting rods may move the substrate S to the supporter 411 after the floating chuck 210 releases the substrate S.

The second pad driving parts 425b, 425c, and 425d may be used to transfer the second suction pad 425a toward the warpage region of the substrate S. For example, the second lifting part 425b may transfer the second suction pad 425a in the upward direction. The pivotal part 425d and the second lifting part 425b may be driven to rotate the second suction pad 425a in a direction away from the first suction part 421. For example, the second suction pad 425a may have a top surface that is substantially coplanar with the second surface S2 of the warpage region. The second suction pad 425a may be used to apply vacuum pressure to the second surface S2 of the warpage region. For example, the second surface S2 of the warpage region may be in contact with the second suction pad 425a, when it is held by the second suction pad 425a. When the second suction pad 425a holds the warpage region of the substrate S, the first suction pad 421a may be positioned at a higher level than that of the second suction pad 425a, e.g., when the second suction pads 425a receive the substrate S. For example, the first and second suction pads 421a and 425a may move to be at substantially the same level of height after the second suction pads 425a receive the substrate S.

Referring to FIG. 8C, the first and second pad driving parts 421b, 421c, 425b, 425c, and 425d may be used to transfer the first and second suction pads 421a and 425a holding the substrate S in the downward direction, e.g., toward the supporter 411.

When the second suction pad 425a is lowered by the second lifting part 425b, the pivotal part 425d may be used to rotate the second suction pad 425a and the second lifting part 425b in a direction toward the first suction part 421, and the driving motor 425c may be used to transfer the second lifting part 425b and the second suction pad 425a in a direction away from the first suction part 421, for example, in the y direction Y, in a direction opposite to the y direction Y, in the x direction X, in an opposite x direction, or in a redial direction according to respective positions of the second suction parts 425. Accordingly, the substrate S may become approximately or substantially flat, and the first and second lifting parts 421b and 425b may be positioned to be roughly or substantially parallel to the z direction Z.

The first sensor unit 431 may be used to measure z positions of the first and second suction pads 421a and 425a. The controller 500 may control the first and second lifting parts 421b and 425b, based on the z position information measured by the first sensor unit 431. The first and second lifting parts 421b and 425b may transfer the first and second suction pads 421a and 425a in the downward direction so as to dispose the substrate S on the supporting part 411b of the supporter 411.

The first and second suction pads 421a and 425a may stop applying the suction force to the second surface S2 of the substrate S. For example, the first and second suction pads 421a and 425a may release the substrate S after the substrate S is disposed on the supporting part 411b of the supporter 411. For example, the first and second pad driving parts 421b, 421c, 425b, and 425c may transfer the first and second suction pads 421a and 425a in the downward direction (e.g., to a position below the support unit 410). For example, the first and second suction pads 421a and 425a may move below the supporter 411 after they release the substrate S.

The gripping part 415a of the clamp 415 may rotate about the hinge axis 415b to grip the edge of the substrate S. Accordingly, the substrate S may be fastened to the support unit 410. For example, the clamp 415 may grip the edge of the substrate S before or after the release of the substrate S from the suction pads.

According to some embodiments of the inventive concept, flatness of a substrate may be adjusted and thereby the substrate may be load on a support unit without a warpage issue. As such, the substrate is prevented from being abnormally loaded on the support unit.

A substrate may be held in a non-contact state and transferred to the support unit. For example, it may be helpful to prevent or suppress a breakage issue caused by a chuck being contact with the substrate.

While example embodiments of the inventive concepts have been particularly shown and described, it will be understood by one of ordinary skill in the art that variations in form and detail may be made therein without departing from the spirit and scope of the attached claims.

What is claimed is:

1. A substrate processing apparatus, comprising:
a substrate jig device; and
a transfer unit configured to hold a substrate in a non-contact state and transfer the substrate toward the substrate jig device,
wherein the substrate jig device comprises:
a supporter configured to support an edge of the substrate and having an opening;
a first suction part overlapping with a center region of the opening and configured to move in a first direction, the first direction being a direction passing through the opening; and
a plurality of second suction parts overlapping with an edge region of the opening and configured to move toward the opening.

2. The apparatus of claim 1, wherein the transfer unit is positioned above the supporter, and
the first suction part is configured to be positioned below the supporter.

3. The apparatus of claim 1, wherein the second suction parts are configured to be positioned above or below the supporter.

4. The apparatus of claim 1, wherein the first suction part comprises:
a first suction pad configured to hold the substrate; and
a first lifting part configured to lift up or down the first suction pad in the first direction, the first lifting part comprising an end portion connected to the first suction pad, and
wherein each of the second suction parts comprises:
a second suction pad configured to hold the substrate; and
a second lifting part configured to lift up or down the second suction pad in the first direction, the second lifting part comprising an end portion connected to the second suction pad.

5. The apparatus of claim 4, wherein each of the second suction parts further comprises a driving motor that is configured to move the second suction pad in a second direction different from the first direction and is connected to the other end portion of the second lifting part.

6. The apparatus of claim 5, wherein the driving motor is configured to move the second suction pad in a third direction different from the first and second directions.

7. The apparatus of claim 5, wherein the first direction and the second direction are orthogonal to each other.

8. The apparatus of claim 4, wherein each of the second suction parts further comprises a pivotal part that is connected to another end portion of the second lifting part and is configured to rotate the second lifting part.

9. The apparatus of claim 4, wherein the first and second suction pads are configured to supply compressed gas toward the substrate or to apply negative pressure to the substrate.

10. The apparatus of claim 1, further comprising a sensor unit configured to measure positions, in the first direction, of the first and second suction parts.

11. The apparatus of claim 1, wherein the substrate jig device comprises a plurality of clamps that are provided on the supporter and has a rotatable structure capable of gripping the edge of the substrate.

12. The apparatus of claim 11, wherein the plurality of clamps are arranged along the edge of the opening.

13. The apparatus of claim 1, wherein the transfer unit comprises at least one floating chuck configured to supply compressed gas toward the substrate.

14. The apparatus of claim 13, wherein the first suction part is provided to face the at least one floating chuck, when the first suction part is used to hold the substrate.

15. A substrate processing apparatus, comprising:
a substrate jig device; and
a transfer unit comprising at least one floating chuck and a transfer driving unit,
wherein the at least one floating chuck is configured to hold a substrate in a non-contact state, and
the transfer driving unit is configured to transfer the at least one floating chuck toward the substrate jig device,
wherein the substrate jig device comprises:
a supporter with an opening, the supporter having a ring shape; and
a suction unit comprising a plurality of suction parts that overlap with the opening and are configured to move toward the opening,
wherein the suction parts comprise:
a first suction part configured to move in a first direction and to hold a center region of the substrate transferred by the transfer unit, the first direction being a direction penetrating the opening; and
a plurality of second suction parts configured to move toward the opening and to hold an edge region of the substrate transferred by the transfer unit.

16. The apparatus of claim 15, wherein the transfer unit is positioned above the supporter, and
the first suction part is configured to be positioned below the supporter.

17. The apparatus of claim 15, wherein the second suction parts are configured to be positioned above or below the supporter.

18. The apparatus of claim 15, wherein the first suction part comprises:
a first suction pad configured to hold the substrate; and
a first lifting part configured to lift up or down the first suction pad in the first direction, the first lifting part comprising an end portion connected to the first suction pad, and
wherein each of the second suction parts comprises:
a second suction pad configured to hold the substrate; and
a second lifting part configured to lift up or down the second suction pad in the first direction, the second lifting part comprising an end portion connected to the second suction pad.

19. The apparatus of claim 18, wherein each of the second suction parts further comprises a driving motor that is configured to transfer the second suction pad in a second direction different from the first direction and is connected to another end portion of the second lifting part.

20. The apparatus of claim 19, wherein the driving motor is configured to move the second suction pad in a third direction different from the first and second directions.

\* \* \* \* \*